(12) United States Patent
Kobayashi et al.

(10) Patent No.: US 10,553,463 B2
(45) Date of Patent: Feb. 4, 2020

(54) TEMPERATURE CONTROL SYSTEM, SEMICONDUCTOR MANUFACTURING DEVICE, AND TEMPERATURE CONTROL METHOD

(71) Applicants: Tokyo Electron Limited, Tokyo (JP); CKD Corporation, Aichi (JP)

(72) Inventors: Atsushi Kobayashi, Miyagi (JP); Atsuhiko Tabuchi, Miyagi (JP); Hideki Wakai, Miyagi (JP); Kazutoshi Itoh, Aichi (JP); Yasuhisa Hirose, Aichi (JP); Keiichi Nishikawa, Aichi (JP); Takahiro Minatani, Aichi (JP)

(73) Assignees: Tokyo Electron Limited, Tokyo (JP); CKD Corporation, Aichi (JP)

( * ) Notice: Subject to any disclaimer, the term of this patent is extended or adjusted under 35 U.S.C. 154(b) by 75 days.

(21) Appl. No.: 15/988,128

(22) Filed: May 24, 2018

(65) Prior Publication Data
US 2018/0269090 A1 Sep. 20, 2018

Related U.S. Application Data

(63) Continuation-in-part of application No. 14/354,198, filed as application No. PCT/JP2012/079431 on Nov. 13, 2012, now Pat. No. 9,984,908.

(30) Foreign Application Priority Data

Nov. 15, 2011 (JP) ................... 2011-249360

(51) Int. Cl.
*H01L 21/67* (2006.01)
*H01L 21/683* (2006.01)
*H01L 21/66* (2006.01)

(52) U.S. Cl.
CPC .... *H01L 21/67248* (2013.01); *H01L 21/6831* (2013.01); *H01L 22/10* (2013.01)

(58) Field of Classification Search
CPC ......... H01L 21/67103; H01L 21/67248; H01L 21/67109; H01L 21/6831; H01L 22/10; F28D 15/046
(Continued)

(56) References Cited

U.S. PATENT DOCUMENTS 2,486,833 A 11/1949 Freund
3,259,175 A 7/1966 Kraus et al.
(Continued)

FOREIGN PATENT DOCUMENTS

CN 101295186 10/2008
CN 102251553 11/2011
(Continued)

*Primary Examiner* — Devon Russell
(74) *Attorney, Agent, or Firm* — IPUSA, PLLC

(57) ABSTRACT

A temperature control system includes a first temperature adjustment unit storing fluid at a first temperature; a second temperature adjustment unit storing fluid at a second temperature higher than the first temperature; a low-temperature flow path for passing fluid supplied from the first temperature adjustment unit; a high-temperature flow path for passing fluid supplied from the second temperature adjustment unit; a bypass flow path for circulating fluid; a combination flow path for passing fluid from the low-temperature flow path, the high-temperature flow path, and the bypass flow path merged at a merging part; a temperature adjustment part that passes fluid from the combination flow path and cools/heats a member of a semiconductor manufacturing device; and a control device that controls valve positions of variable valves attached to the three flow paths upstream of the merging part and adjusts the flow rate distribution ratio for the three flow paths.

12 Claims, 9 Drawing Sheets

(58) Field of Classification Search
USPC .................................... 165/104.19, 104.28
See application file for complete search history.

(56) References Cited

U.S. PATENT DOCUMENTS

| | | | |
|---|---|---|---|
| 3,556,201 A | 1/1971 | Sander | |
| 4,967,832 A * | 11/1990 | Porter | H01L 23/4735 |
| | | | 165/104.32 |
| 5,395,451 A | 3/1995 | Triculis | |
| 5,603,230 A | 2/1997 | Tsai | |
| 5,810,977 A | 9/1998 | Annecharico et al. | |
| 5,823,007 A | 10/1998 | Chang | |
| 6,362,944 B1 | 3/2002 | Tustaniwskyj et al. | |
| 6,907,923 B2 | 6/2005 | Sienel | |
| 7,000,691 B1 | 2/2006 | Weber | |
| 8,790,007 B2 | 7/2014 | Goto | |
| 2003/0037919 A1 | 2/2003 | Okada et al. | |
| 2004/0051545 A1 | 3/2004 | Tilton et al. | |
| 2004/0250985 A1 | 12/2004 | Romem | |
| 2005/0151553 A1 | 7/2005 | Kabbani et al. | |
| 2007/0267188 A1 | 11/2007 | Di Stefano et al. | |
| 2008/0223555 A1 | 9/2008 | Di Stefano | |
| 2008/0247924 A1 | 10/2008 | Yui | |
| 2008/0264353 A1 | 10/2008 | Eli | |
| 2008/0314564 A1 | 12/2008 | Nagaseki et al. | |
| 2010/0163183 A1 | 7/2010 | Tanaka et al. | |
| 2011/0066294 A1 | 3/2011 | Takechi et al. | |
| 2012/0080168 A1 | 4/2012 | Hemrle et al. | |
| 2013/0292084 A1 | 11/2013 | Luz et al. | |
| 2016/0009537 A1 | 1/2016 | Orita | |

FOREIGN PATENT DOCUMENTS

| | | |
|---|---|---|
| JP | S58-215309 | 12/1983 |
| JP | H11-184537 | 7/1999 |
| JP | 2002-140119 | 5/2002 |
| JP | 2009-015594 | 1/2009 |
| JP | 2009-117443 | 5/2009 |
| JP | 2010-117812 | 5/2010 |

* cited by examiner

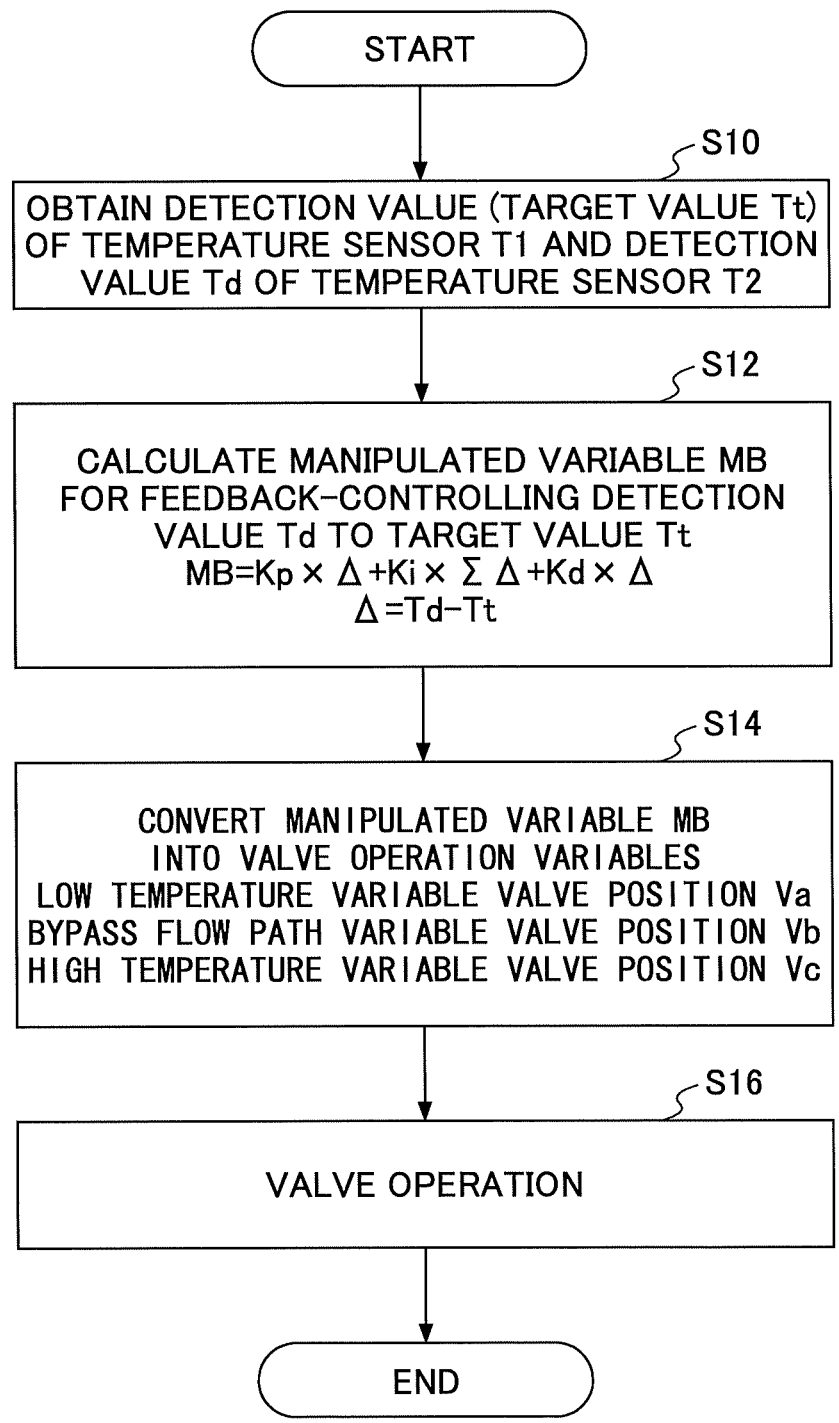

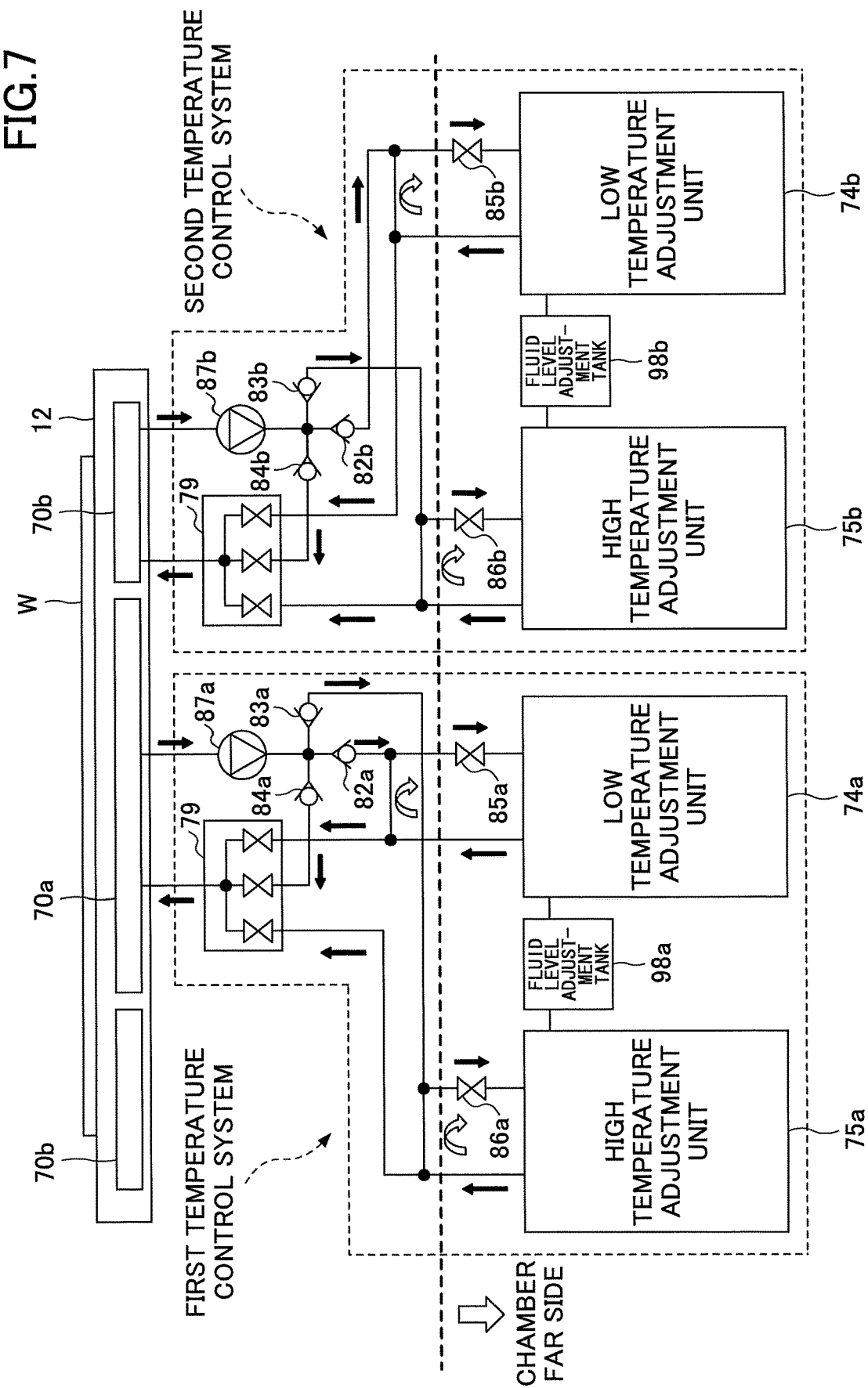

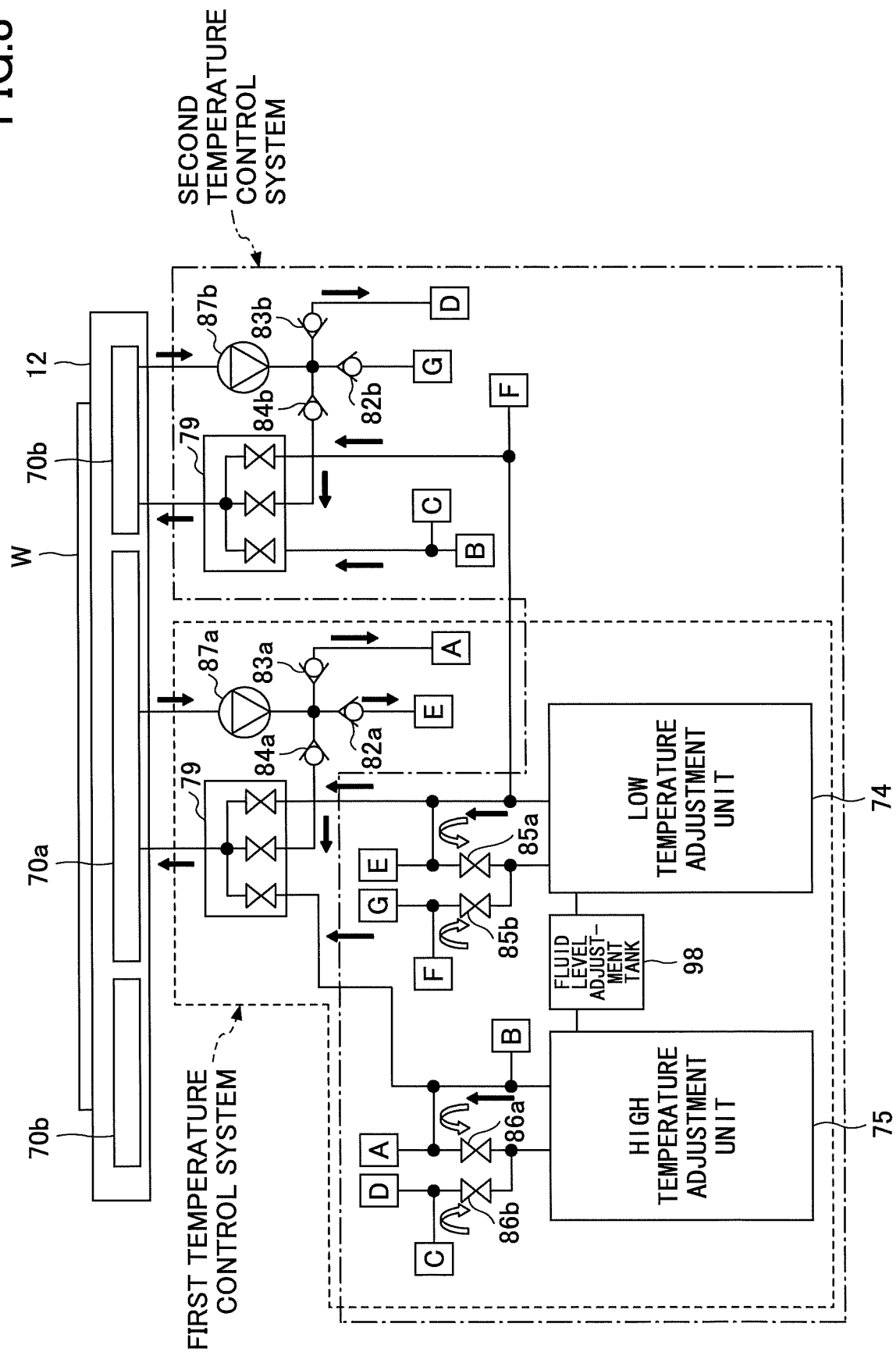

TEMPERATURE CONTROL SYSTEM, SEMICONDUCTOR MANUFACTURING DEVICE, AND TEMPERATURE CONTROL METHOD

CROSS-REFERENCE TO RELATED APPLICATION

This application is a continuation-in-part patent application of, and claims the benefit of and priority to U.S. patent application Ser. No. 14/354,198 filed on Apr. 25, 2014, which is based on and claims the benefit of priority of Japanese Patent Application No. 2011-249360 filed on Nov. 15, 2011, the entire contents of which are herein incorporated by reference.

TECHNICAL FIELD

The present invention relates to a temperature control system, a semiconductor manufacturing device, and a temperature control method.

BACKGROUND ART

Temperature control of a workpiece placed on an electrostatic chuck is generally performed using a heater and a chiller unit arranged within the electrostatic chuck. In such a system, cooling is performed by circulating a coolant at a predetermined temperature through a coolant pipe of the chiller unit and heating is performed by applying an alternating current to the heater. Through such heating by the heater and cooling by the chiller unit, the wafer temperature of a wafer placed on the electrostatic chuck may be adjusted to a desired temperature.

In such a system, a low-temperature coolant (fluid) is arranged to be flowing within the chiller unit at a constant flow rate. To raise the temperature in such a state, the heater that is embedded within a stage has to be heated. However, heating takes a relatively long period of time due to the cooling effect of the chiller unit, and such poor responsiveness to temperature control has been a problem.

To address such a problem, a method has been proposed that involves reducing the flow rate of the low-temperature fluid flowing within the chiller unit. However, in such a case, the cooling capacity of the chiller unit is degraded, the cooling speed of the system is decreased, and temperature controllability is degraded. Another potential method involves increasing the capacity of the heater. However, a high frequency power leak current is increased in such a case. That is, in a semiconductor manufacturing device, when a heater is embedded within an electrostatic chuck that is arranged on a stage and is applied a high frequency power, the high frequency power may be leaked outside via a heater line, and the leak current increases as the capacity of the heater is increased.

In applying a high frequency power within a chamber, precautionary measures have to be implemented to prevent the high frequency power from leaking outside the chamber. Accordingly, a heater line and heater power supply filter are arranged to prevent the high frequency power from leaking outside the chamber. However, when the capacity of the heater is increased, the size of the heater power supply filter has to be increased as well. Also, the heater power supply filter has to be arranged close to the member having the heater embedded. Thus, when the size of the heater power supply filter is increased, the heater power supply filter takes up extra space thereby reducing the space for mounting other components.

Accordingly, in another potential method, the temperature may be controlled without using a heater. For example, Patent Document 1 discloses a temperature control system that includes a heating cycle that heats and circulates a fluid, and a cooling cycle that cools and circulates a fluid. The temperature control system is configured to control the temperature of an electrostatic chuck by controlling the flow rate distribution ratios of fluid flowing through circulation paths of the heating cycle and the cooling cycle. In the temperature control system disclosed in Patent Document 1, the heating cycle and the cooling cycle respectively circulate fluids within completely closed and separate pipe systems. A high-temperature fluid indirectly heated through heat exchange with the high-temperature fluid circulating within the heating cycle and a low-temperature fluid indirectly heated through heat exchange with the low-temperature fluid circulating within the cooling cycle are mixed and circulated through a pipe within an electrostatic chuck. The temperature controllability of such a system depends on the amount of fluid that can be stored in heat storage tanks at any given point in time. That is, to maintain the temperature controllability of the above temperature control system, the amount of fluid stored in the heat storage tanks have to exceed a predetermined threshold for ensuring temperature stability.

PRIOR ART DOCUMENTS

Patent Documents

Patent Document 1: Japanese Laid-Open Patent Publication No. 2010-117812

SUMMARY OF THE INVENTION

Problem to be Solved by the Invention

However, in the temperature control system of Patent Document 1, the tanks of the cycles storing fluid are not capable of constantly retaining a certain amount of fluid at any given time. Thus, there may be cases where fluid stored in the tanks cannot be controlled to a pre-set temperature and temperature controllability may be compromised as a result.

In light of the above, one aspect of the present invention relates to providing a temperature control system, a semiconductor manufacturing device, and a temperature control method that can secure adequate heat storage volume and perform stable temperature control by arranging in parallel a plurality of temperature adjustment units including heat storage tanks and circulation pumps and forming a circulation path for circulating fluid stored in the heat storage tanks of the temperature control units.

Means for Solving the Problem

According to one embodiment of the present invention, a temperature control system for controlling a temperature of a member used in a semiconductor manufacturing device is provided. The temperature control system includes a first temperature adjustment unit that stores fluid adjusted to a first temperature; a second temperature adjustment unit that stores fluid adjusted to a second temperature, which is higher than the first temperature; a low-temperature flow path for passing fluid supplied from the first temperature adjustment unit; a high-temperature flow path for passing fluid supplied from the second temperature adjustment unit; a bypass flow path for circulating fluid; a combination flow path for passing fluid from the low-temperature flow path, the high-temperature flow path, and the bypass flow path merged at a merging part; a temperature adjustment part that is arranged at or near the member and is configured to pass fluid from the combination flow path and cool or heat the member; variable valves attached to the low-temperature flow path, the high-temperature flow path, and the bypass flow path at an upstream side of the merging part; and a control device that controls valve positions of the variable valves and adjusts a flow rate distribution ratio for the low-temperature flow path, the high-temperature flow path, and the bypass flow path.

According to another embodiment of the present invention, a semiconductor manufacturing device that controls a temperature of an internal member using a temperature control system is provided. The temperature control system includes a first temperature adjustment unit that stores fluid adjusted to a first temperature; a second temperature adjustment unit that stores fluid adjusted to a second temperature, which is higher than the first temperature; a low-temperature flow path for passing fluid supplied from the first temperature adjustment unit; a high-temperature flow path for passing fluid supplied from the second temperature adjustment unit; a bypass flow path for circulating fluid; a combination flow path for passing fluid from the low-temperature flow path, the high-temperature flow path, and the bypass flow path merged at a merging part; a temperature adjustment part that is arranged at or near the internal member and is configured to pass fluid from the combination flow path and cool or heat the internal member; variable valves attached to the low-temperature flow path, the high-temperature flow path, and the bypass flow path at an upstream side of the merging part; and a control device that controls valve positions of the variable valves and adjusts a flow rate distribution ratio for the low-temperature flow path, the high-temperature flow path, and the bypass flow path.

According to another embodiment of the present invention, a temperature control method for controlling a temperature of a member used in a semiconductor manufacturing device is provided. The temperature control method includes storing fluid adjusted to a first temperature in a first temperature adjustment unit; storing fluid adjusted to a second temperature, which is higher than the first temperature, in a second temperature adjustment unit; passing fluid supplied from the first temperature adjustment unit through a low-temperature flow path; passing fluid supplied from the second temperature adjustment unit through a high-temperature flow path; circulating fluid through a bypass flow path; merging the fluids flowing in the low-temperature flow path, the high-temperature flow path, and the bypass flow path at a merging part and passing the merged fluid through a combination flow path; passing fluid from the combination flow path through a temperature adjustment part arranged at or near the member and cooling or heating the member; and controlling valve positions of variable valves attached to the low-temperature flow path, the high-temperature flow path, and the bypass flow path at an upstream side of the merging part, and adjusting a flow rate distribution ratio for the low-temperature flow path, the high-temperature flow path, and the bypass flow path.

Advantageous Effect of the Invention

According to an aspect of the present invention, a temperature control system, a semiconductor manufacturing device, and a temperature control method may be provided that can secure adequate heat storage volume and perform stable temperature control by arranging in parallel a plurality of temperature adjustment units including heat storage tanks and circulation pumps and forming a circulation path for circulating fluid stored in the heat storage tanks of the temperature control units.

BRIEF DESCRIPTION OF THE DRAWINGS

FIG. 2 is a flowchart illustrating a temperature feedback control process according to an embodiment of the present invention;

FIG. 7 illustrates an overall configuration of a first modification of the embodiment; and FIG. 8 illustrates an overall configuration of a second modification of the embodiment.

EMBODIMENTS FOR IMPLEMENTING THE INVENTION

Figure 1A:
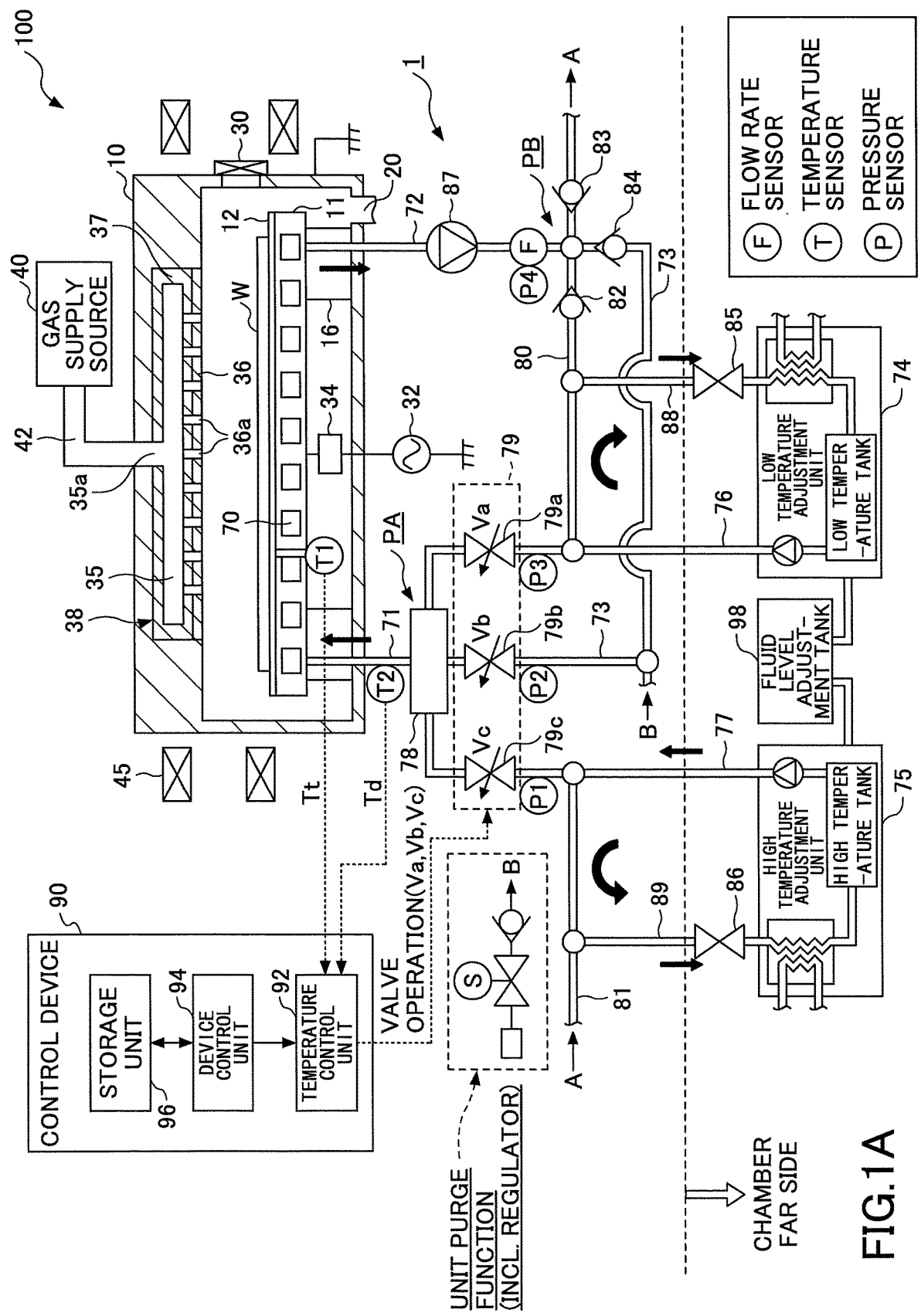
FIG. 1A illustrates an overall configuration of a temperature control system according to an embodiment of the present invention.

In the following, embodiments of the present invention are described with reference to the accompanying drawings. Note that elements having substantially the same functions or features may be given the same reference numerals and overlapping descriptions thereof may be omitted.

[Overall Configuration of Semiconductor Manufacturing Device and Temperature Control System]

(Semiconductor Manufacturing Device)

An overall configuration of a temperature control system 1 according to an embodiment of the present invention is described below with reference to FIG. 1A. In the present embodiment, temperature control of a semiconductor manufacturing device 100 is implemented by the temperature control system 1.

The semiconductor manufacturing device 100 illustrated in FIG. 1A is a RIE (reactive ion etching) type plasma processing device and includes a cylindrical processing chamber (chamber) 10 made of metal such as aluminum or stainless steel, for example. The processing chamber 10 is grounded. A stage 11 that holds a semiconductor wafer W (simply referred to as "wafer W" hereinafter) is arranged within the processing chamber 10. The stage 11 may be made of aluminum, for example, and is supported by a cylindrical support 16 extending vertically from the bottom of the processing chamber 10 via an insulating cylindrical holding section (not shown). An electrostatic chuck 12 for holding the wafer W with an electrostatic attraction force is arranged at a top surface of the stage 11. When a DC voltage is applied to the electrostatic chuck 12, the wafer W may be electrostatically attracted to the electrostatic chuck 12 by a Coulomb force. The wafer W is placed on the electrostatic chuck 12. In the present embodiment, the electrostatic chuck 12 is an example of a member subject to temperature control. In the present embodiment, the temperature of the wafer W is controlled to a predetermined temperature by controlling the temperature of the electrostatic chuck 12.

An exhaust path 20 is formed between a side wall of the processing chamber 10 and the cylindrical support 16. The exhaust path 20 is connected to an exhaust device (not shown) and is configured to depressurize a processing space within the processing chamber 10 to a predetermined degree of vacuum using a vacuum pump. A gate valve 30 that opens/closes a wafer transfer port is arranged at a side wall of the processing chamber 10 to allow the wafer W to be transferred in/out of the processing chamber 10.

A high frequency power supply 32 for plasma generation is connected to the stage 11 via a matching unit 34. The high frequency power supply 32 supplies a high frequency power of 60 MHz, for example, to the stage 11. In this way, the stage 11 may also act as a lower electrode. Also, a shower head 38 (described below) is arranged at a ceiling portion of the processing chamber 10 as an upper electrode at ground potential. In this way, a high frequency voltage from the high frequency power supply 32 may be capacitatively supplied between the stage 11 and the shower head 38.

The shower head 38 at the ceiling portion of the processing chamber 10 includes an electrode plate 36 having multiple gas holes 36a and an electrode support 37 that detachably supports the electrode plate 36. A buffer chamber 35 is arranged within the electrode support 37, and a gas supply source 40 is connected to a gas introduction port 35a of the buffer chamber 35 via a gas supply pipe 42. In this way, desired gas may be supplied to the processing chamber 10 from the gas supply source 40.

A magnet 45 is annularly or concentrically arranged around the processing chamber 10. A vertical RF electric field is created within a plasma generation space between the shower head 38 and the stage 11 by the high frequency power supply 32. High frequency electrical discharge causes the generation of plasma at a high density near the surface of the electrostatic chuck 12. An etching process may be performed on the wafer W that is controlled to be at a predetermined temperature within the processing chamber 10 by the action of the generated plasma.

(Temperature Control System)

The temperature control system 1 of the present embodiment has two heat storage circulation circuits including a low-temperature adjustment unit 74 and a high-temperature adjustment unit 75. The two circulation circuits each have a large tank for storing fluid and a circulation pump. The amount of fluid stored in each tank is arranged to be at least a predetermined amount for ensuring temperature stability. In this way, temperature controllability of the temperature control system 1 may be maintained and stable temperature control may be enabled. The low-temperature adjustment unit 74 is an example of a first temperature adjustment unit that stores a fluid adjusted to a first temperature. The high-temperature adjustment unit 75 is an example of a second temperature adjustment unit that stores a fluid adjusted to a second temperature, which is higher than the first temperature.

The low-temperature adjustment unit 74 includes a low-temperature tank for storing fluid that is adjusted to a first temperature by a heat exchange unit arranged within the low-temperature adjustment unit 74. The high-temperature adjustment unit 75 includes a high-temperature tank for storing fluid that is adjusted to a second temperature, which is higher than the first temperature, by a heat exchange unit arranged within the high-temperature adjustment unit 75. The first temperature and the second temperature are controlled by a control device 90, which is described below. The low-temperature adjustment unit 74 and the high-temperature adjustment unit 75 are relatively large and are arranged at some distance away from the processing chamber 10 in consideration of the space required for arranging other components such as the exhaust device in the vicinity of the semiconductor manufacturing device 100. A low-temperature coolant (fluid) stored in the low-temperature adjustment unit 74 flows through a low-temperature flow path 76 to reach a merging part PA where it merges with fluid circulated through a bypass flow path 73. Similarly, a high-temperature coolant (fluid) stored at the high-temperature adjustment unit 75 flows through a high-temperature flow path 77 to reach the merging part PA where it merges with the fluid circulated through the bypass flow path 73. A temporary tank 78 is arranged at the merging part PA for mixing the fluids flowing in the low-temperature flow path 76, the high-temperature flow path 77, and the bypass flow path 73. The fluids from the low-temperature flow path 76, the high-temperature flow path 77, and the bypass flow path 73 that merge at the merging part PA and are mixed together at the temporary tank 78 flow through a combination flow path 71. By arranging the mixed fluid to flow through the combination flow path 71 in the manner described above, the temperature of fluid flowing through a temperature adjustment part 70 may be stabilized and temperature controllability may be improved.

The temperature adjustment part 70 corresponding to a pipe (flow path) for passing fluid is arranged within the stage 11. Fluid from the combination flow path 71 is passed through the temperature adjustment part 70, and in this way, the electrostatic chuck 12 may be cooled or heated. Combination flow paths 71 and 72 are respectively connected to a fluid inlet side and a fluid outlet side of the temperature adjustment part 70. The temperature adjustment part 70 is an example of a temperature adjustment part that is arranged at or near a member subject to temperature control and is configured to pass fluid from the combination flow path 71 to cool or heat the member.

The combination flow paths 71 and 72 form a circulation path for passing fluid through the temperature adjustment part 70 and prompting the fluid to branch out to a low-temperature flow path 80, a high-temperature flow path 81, and a bypass flow path 73 at a branching part PB. By adjusting the temperature of the fluid circulated within the circulation path to a pre-set temperature, the temperature of the fluid within the temperature adjustment part 70 may be controlled and the temperature of the wafer W may be adjusted to a predetermined processing temperature.

As can be appreciated from the above, in the temperature control system 1 of the present embodiment, the fluids flowing through the high-temperature flow path 77 and the low-temperature flow path 76 may flow directly into the circulation path via the merging part PA.

A valve unit 79 includes variable valves 79a, 79b, and 79c. The variable valves 79a, 79b, and 79c are arranged at the low-temperature flow path 76, the bypass flow path 73, and the high-temperature flow path 77, respectively. By changing the valve positions Va, Vb, and Vc of the variable valves 79a, 79b, and 79c, the merging flow rates of the fluids flowing from the above flow paths and merging into the combination flow path 71 may be adjusted.

Also, the valve unit 79 is further configured to change a mixing ratio of the fluid from the high-temperature flow path 77 and the fluid from the bypass flow path 73, and/or a mixing ratio of the fluid from the low-temperature flow path 76 and the fluid from the bypass flow path 73.

The control device 90 is configured to perform an energy saving mode operation by changing the mixing ratio of the fluid from the high-temperature flow path 77 and the fluid from the bypass flow path 73, and/or the mixing ratio of the fluid from the low-temperature flow path 76 and the fluid from the bypass flow path 73.

The valve unit 79 is arranged near the electrostatic chuck 12 corresponding to the member subject to temperature adjustment, and in this way, temperature control responsiveness may be improved.

Check valves 82, 83, and 84 are arranged at the low-temperature flow path 80, the high-temperature flow path 81, and the bypass flow path 73 branching out from the branching part PB, and in this way fluid branching out from the branching part PB to flow in three different directions may be prevented from back-flowing. The fluid flowing into the low-temperature flow path 80 returns to the low-temperature adjustment unit 74 and is re-adjusted to the first temperature within the low-temperature adjustment unit 74. A valve 85 is arranged at a pipe 88, which is connected to the low-temperature flow path 80, and the valve 85 is configured to adjust the flow rate of the fluid returning to the low-temperature adjustment unit 74 from the low-temperature flow path 80 via the pipe 88.

Similarly, the fluid flowing into the high-temperature flow path 81 (connected from the right side to the left side by arrow A in FIG. 1A) returns to the high-temperature adjustment unit 75 and is re-adjusted to the second temperature within the high-temperature adjustment unit 75. A valve 86 is arranged at a pipe 89, which is connected to the high-temperature flow path 81, and the valve 86 is configured to adjust the flow rate of the fluid returning to the high-temperature adjustment unit 75 from the high-temperature flow path 81 via the pipe 89.

The control device 90 controls the rotation speed of an inverter of a pump 87 attached to the combination flow path 72 and controls the flow rate of fluid flowing into the temperature adjustment part 70. Also, the control device 90 controls the valve unit 79, which adjusts the merging flow rates of fluid merging into the combination flow 71 in the manner described above. In this way, the control device 90 adjusts the pressure within the low-temperature flow path 76, the bypass flow path 73, and the high-temperature flow path 77 corresponding to pipes at the fluid supply side. Thus, the flow rate within the circulation path including the temperature adjustment part 70 may be maintained constant, and fluid branching out at the branching part PB may be circulated through the bypass flow path 73, or returned to the low-temperature adjustment unit 74 or the high-temperature adjustment unit 75. In this way, the amount of fluid stored at the low-temperature adjustment unit 74 and the high-temperature adjustment unit 75 may be arranged to be the same. Note that a flow meter F and a pressure gauge P4 arranged at pipes near the branching part PB and pressure gauges P1, P2, and P3 arranged at pipes near the valve unit 79 are used in the above-described flow rate adjustment and pressure adjustment.

Note that although the check valves 82, 83, and 84 are arranged at the low-temperature flow path 80, the high-temperature flow path 81, and the bypass flow path 73, a difference in the fluid levels at the high-temperature adjustment unit 75 and the low-temperature adjustment unit 74 may be created as a result of slight errors in the above-described pressure adjustment or a deviation of fluid toward the high-temperature flow path 77 side upon supplying fluid from the low-temperature adjustment unit 74, for example.

In this respect, a fluid level adjustment tank 98 is arranged near the low-temperature adjustment unit 74 and the high-temperature adjustment unit 75 to communicate with the low-temperature tank and the high-temperature tank of the low-temperature adjustment unit 74 and the high-temperature adjustment unit 75 so that such a difference in the fluid levels may be adjusted. That is, by arranging the fluid level adjustment tank 98, the fluid levels at the three tanks may naturally fall in line with one another.

Figure 1B:
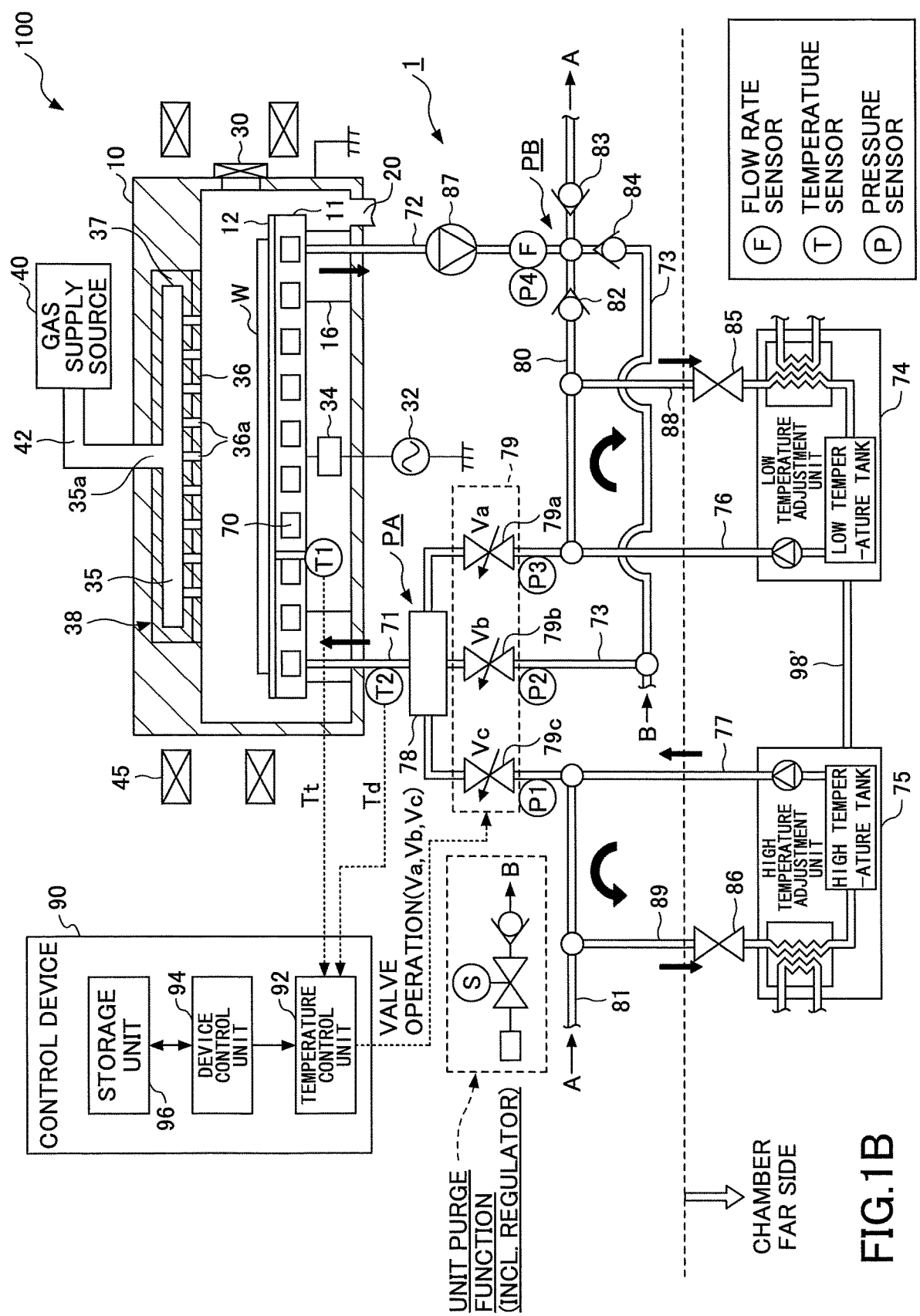
FIG. 1B illustrates an alternative configuration of the temperature control system where a communication pipe is provided instead of a fluid level adjustment tank.

Alternatively, as shown in FIG. 1B, there is provided a communication pipe 98' between the low-temperature adjustment unit 74 and the high-temperature adjustment unit 75 so that the difference in the fluid levels may be adjusted without the fluid level adjustment tank 98.

Upon raising the temperature, the amount of fluid flowing from the high-temperature adjustment unit 75 may be greater than the amount of fluid flowing from the low-temperature adjustment unit 74, and thus, the fluid level of the high-temperature adjustment unit 75 may become lower than the fluid level at the low-temperature adjustment unit 74. On the other hand, upon lowering the temperature, the fluid level at the low-temperature adjustment unit 74 may become lower than the fluid level at the high-temperature adjustment unit 75. In such cases, fluid stored at the fluid level adjustment tank 98 may flow into the high-temperature tank or the low-temperature tank with the lower fluid level and the fluid levels at the three tanks may naturally fall into line. Note that the fluid level adjustment tank 98 includes a fluid level meter (not shown) that detects an abnormality by measuring the fluid level at the fluid level adjustment tank 98.

As described above, the temperature control system 1 according to the present embodiment implements temperature control without using a heater. The temperature control system 1 according to the present embodiment uses fluid systems in two different temperatures, adjusts the temperatures of a low-temperature fluid and a high-temperature fluid, mixes the fluids at predetermined flow rates, and supplies the mixed fluid to the electrostatic chuck 12 so that the electrostatic chuck 12 may be adjusted to a pre-set temperature. The low-temperature flow path and the high-temperature flow path are not separate and closed systems but are open systems that merge at the merging part PA. Note that in a temperature control system including a low-temperature flow path and a high-temperature flow path configured as closed systems, the supply of heated fluid or the supply of cooled fluid may run out during temperature control and temperature controllability may be degraded. For example, the amount of fluid that may be supplied after the temperature is raised may be limited such that after the first few seconds, the supply of heated fluid may run out and the heating capacity of the system may be degraded. For example, in the left side graph of FIG. 6 indicating the temperature Th of a heating device (heating capacity comparison described below), the supply of heated fluid runs out after the first three seconds and the heating capacity is degraded as a result.

However, in the temperature control system 1 according to the present embodiment, the low-temperature tank is provided at the low-temperature adjustment unit 74 for cooling and the high-temperature tank is provided at the high-temperature adjustment unit 75 for heating and the tanks are arranged to be able to store relatively large amounts of fluid so that fluid may be continuously supplied from these tanks without running dry. In this way, high-speed temperature control and stable temperature control may be enabled.

Note that the temperature control system 1 includes a unit purge function that may be used in returning fluid to the tanks by introducing air into pipes as illustrate by arrow B in FIG. 1A, for example.

[Temperature Control Method]

(Functional Configuration of Control Device)

The temperature control system 1 of the present embodiment is controlled by the control device 90. The control device 90 includes a temperature control unit 92, a device control unit 94, and a storage unit 96.

The temperature control unit 92 controls the temperature of the electrostatic chuck 12. Specifically, the temperature control unit 92 adjusts the rotation speed of the inverter of the pump 87 and controls the flow rates of fluid circulated within the bypass flow path 73, the combination flow paths 71 and 72, and the temperature adjustment part 70 to be constant. Also, the temperature control unit 92 controls the valve positions Va, Vb, and Vc of the variable valves 79a, 79b, and 79c, respectively, such that the merging flow rates of fluid flowing from the low-temperature flow path 76, the high-temperature flow path 77, and the bypass flow path 73 and merging into the combination path 71 may be the same.

The device control unit 94 controls the semiconductor manufacturing device 100 based on a recipe stored in the storage unit 96. For example, the device control unit 94 may control the timing at which the gate valve 30 is opened/closed, the timing at which gas is supplied from the gas supply source 40, and the timing at which high frequency power is supplied from the high frequency power supply 32 to perform a microfabrication process on the wafer W using generated plasma.

(Hardware Configuration of Control Device)

The control device 90 includes a CPU (central processing unit), a ROM (read-only memory), and a RAM (random access memory), which are not illustrated. The CPU executes processes according to various recipes stored in the storage unit 96, for example. In this way, the CPU may control processes such as an etching process or a cleaning process, for example. The storage unit 96 may use a storage device such as a semiconductor memory, a magnetic disk, or an optical disk to embody the RAM and the ROM. The recipes may be stored in a recording medium and loaded in the storage unit 96 via a driver (not shown) or downloaded in the storage unit 96 from a network (not shown), for example. Also, the above-described functional features of the control device 90 may be implemented using a DSP (digital signal processor) instead of a CPU, for example. Note that the functions of the control device 90 may be implemented by software, hardware, or combinations thereof.

[Feedback Control]

The temperature control unit 92 monitors a temperature sensor T1, a temperature sensor T2, and the pressure sensors P1, P2, and P3, and feedback-controls the valve positions of the variable valves 79a, 79b, and 79c. The control device 90 feedback-controls the variable valves 79a, 79b, and 79c so that the temperature detected by the temperature sensor T2 may become closer to the temperature detected by the temperature sensor T1 (target temperature).

The temperature sensor T1 is an example of a first temperature sensor that detects the temperature of a member used in the semiconductor manufacturing device 100. In the present example, the temperature sensor T1 detects the temperature of the electrostatic chuck 12. The temperature sensor T2 is an example of a second temperature sensor that detects the temperature of the combination flow path 71 at a downstream side of the merging part PA.

Ordinarily, when no substantial changes are made to the pre-set temperature, the control device 90 circulates fluid within the circulation path (i.e., path for circulating fluid through the bypass flow path 73, the combination path 71, the temperature adjustment part 70, the combination path 72, and back to the bypass flow path 73), and reduces the flow rate of fluid flowing into and out of the tanks of the low-temperature adjustment unit 74 and the high-temperature adjustment unit 75 to circulate fluid in an energy-efficient manner. On the other hand, when raising the temperature, the control device 90 opens up the valve position Vc of the variable valve 79c at the high-temperature flow path 77 to prompt the flow of high-temperature fluid into the circulation path and thereby raise the temperature of the fluid flowing within the combination path 71. When lowering the temperature, the control device 90 opens up the valve position Va of the variable valve 79a at the low-temperature flow path 76 to prompt the flow of low-temperature fluid into the circulation path and thereby lower the temperature of the fluid flowing within the combination path 71.

When raising the temperature, the control device 90 controls the valve positions Va, Vb, and Vc of the variable valves 79a, 79b, and 79c such that the amount of fluid flowing into the combination flow path 71 from the high-temperature flow path 77 may be greater than the amount of fluid flowing into the combination path 71 from the low-temperature flow path 76 and the amount of fluid flowing into the combination path 71 from the bypass flow path 73. When lowering the temperature, the control device 90 controls the valve positions Va, Vb, and Vc of the variable valves 79a, 79b, and 79c such that the amount of fluid flowing into the combination flow path 71 from the low-temperature flow path 76 may be greater than the amount of fluid flowing into the combination path 71 from the high-temperature flow path 77 and the amount of fluid flowing into the combination path 71 from the bypass flow path 73.

Figure 3:
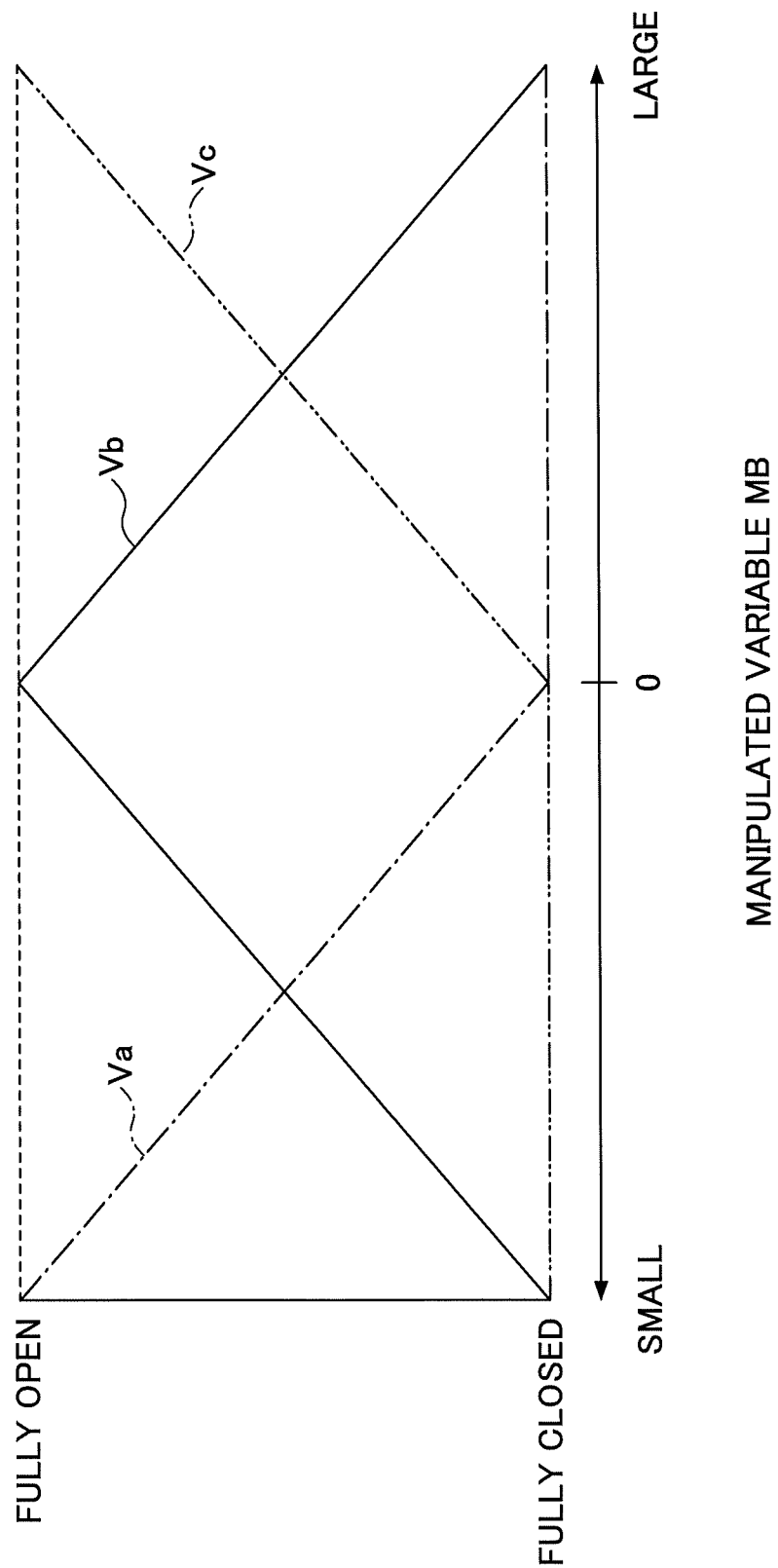
FIG. 3 illustrates an exemplary relationship between a manipulated variable and valve positions of variable valves according to an embodiment of the present invention.

In the following, temperature feedback control implemented by the control device 90 is described in greater detail with reference to FIGS. 2 and 3. FIG. 2 is a flowchart illustrating process steps of a feedback control process executed by the control device 90. FIG. 3 illustrates exemplary valve operation variables (valve positions Va, Vb, and Vc) of the variable valves 79a, 79b, and 79c that are controlled in the feedback control process of FIG. 2. The feedback control process of FIG. 2 may be repetitively executed at predetermined intervals by the temperature control unit 92 of the control device 90, for example.

Upon starting the feedback control process of FIG. 2, in step S10, the temperature control unit 92 obtains a detection value of the temperature sensor T1 as a target value Tt of the temperature of the electrostatic chuck 12. The temperature control unit 92 also obtains the detection value Td of the temperature sensor T2 as the temperature of the fluid merged at the merging part PA.

Then, in step S12, the temperature control unit 92 feedback-controls the valve positions Va, Vb, and Vc of the variable valves 79a, 79b, and 79c based on the detection value Td so that the detection value Td may become closer to the target value Tt. To enable such feedback control of the detection value Td, the temperature control unit 92 calculates a manipulated variable MB to be used as a base for feedback-controlling the valve positions Va, Vb, and Vc.

The manipulated variable MB is calculated based on a divergence of the detection value Td with respect to the target value Tt. Specifically, in the present embodiment, the manipulated value MB is calculated by applying a Proportional-Integral-Derivative (PID) operation on the difference Δ between the detection value Td and the target value Tt.

Then, in step S14, the temperature control unit 92 converts the manipulated variable MB into valve operation variables for the variable valve 79a at the low-temperature flow path 76, the variable valve 79b at the bypass flow path 73, and the variable valve 79c at the high-temperature flow path 77 (i.e., valve positions Va, Vb, and Vc of the variable valves 79a, 79b, and 79c). In the following, the valve operation variables for the variable valves 79a, 79b, and 79c are described with reference to FIG. 3, which illustrates an exemplary relationship between the manipulated variable MB and the valve positions Va, Vb, and Vc.

When the manipulated variable MB is less than zero, the valve position Va of the variable valve 79a decreases in value as the manipulated variable MB increases, and when the manipulated variable MB is greater than or equal to zero, the valve position Va is equal to zero. That is, the flow rate within the low-temperature flow path 76 is increased as the detection value Td increases with respect to the target value Tt, and when the detection value Td is less than or equal to the target value Tt, the low-temperature flow path 76 is not used. Also, when the manipulated variable MB is greater than zero, the valve position Vc of the variable valve 79c increases in value as the manipulated variable MB increases, and when the manipulated variable MB is less than or equal to zero, the valve position Vc is equal to zero. That is, the flow rate of fluid within the high-temperature flow path 77 is increased as the detection value Td decreases with respect to the target value Tt, and when the detection value Td is greater than or equal to the target value Tt, the high-temperature flow path 77 is not used. Further, the valve position Vb of the variable valve 79b decreases in value as the manipulated variable MB deviates from zero. Note that in FIG. 3, the valve positions Va, Vb, and Vc are preferably set up such that the total flow rate of fluid flowing from the three flow paths may not change depending on the manipulated variable MB.

By implementing the above setting, valve operation variables for the three valves; i.e., the variable valves 79a, 79b, and 79c, may be set up based on one manipulated variable MB that is calculated by applying a single PID operation on the difference Δ between the detection value Td and the target value Tt.

After the process of step S14 of FIG. 2 is completed, in step S16, the temperature control unit 92 operates the variable valves 79a, 79b, and 79c to adjust their respective valve positions Va, Vb, and Vc. After the process of step S16 is completed, the feedback control process comes to an end.

By implementing the above-described feedback control process, the detection value Td may be controlled to closely follow the target value Tt.

[Cooling Capacity of Temperature Control System]

Figure 4:
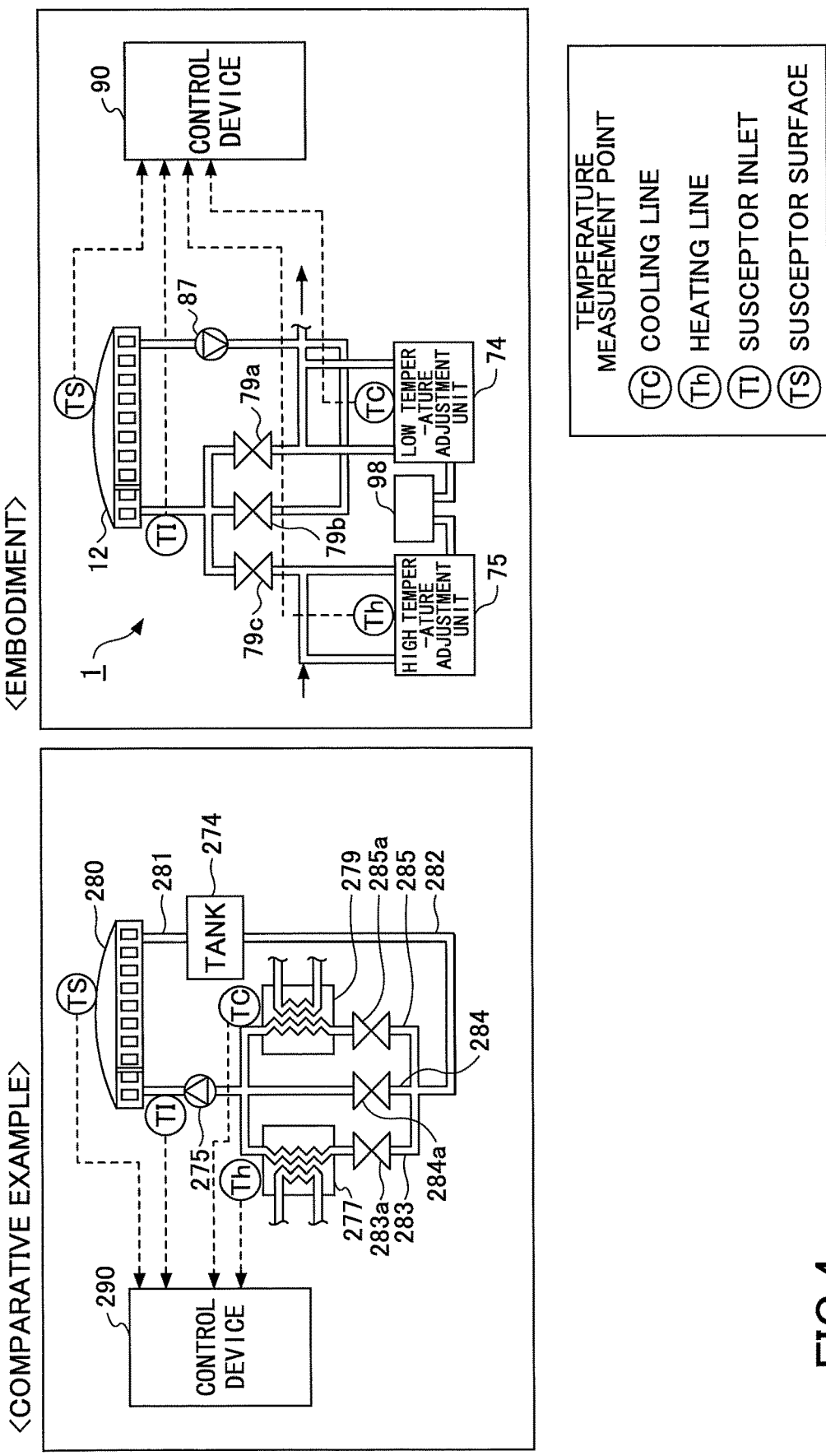
FIG. 4 illustrates temperature control systems according to an embodiment of the present invention and a comparison example.
Figure 5:
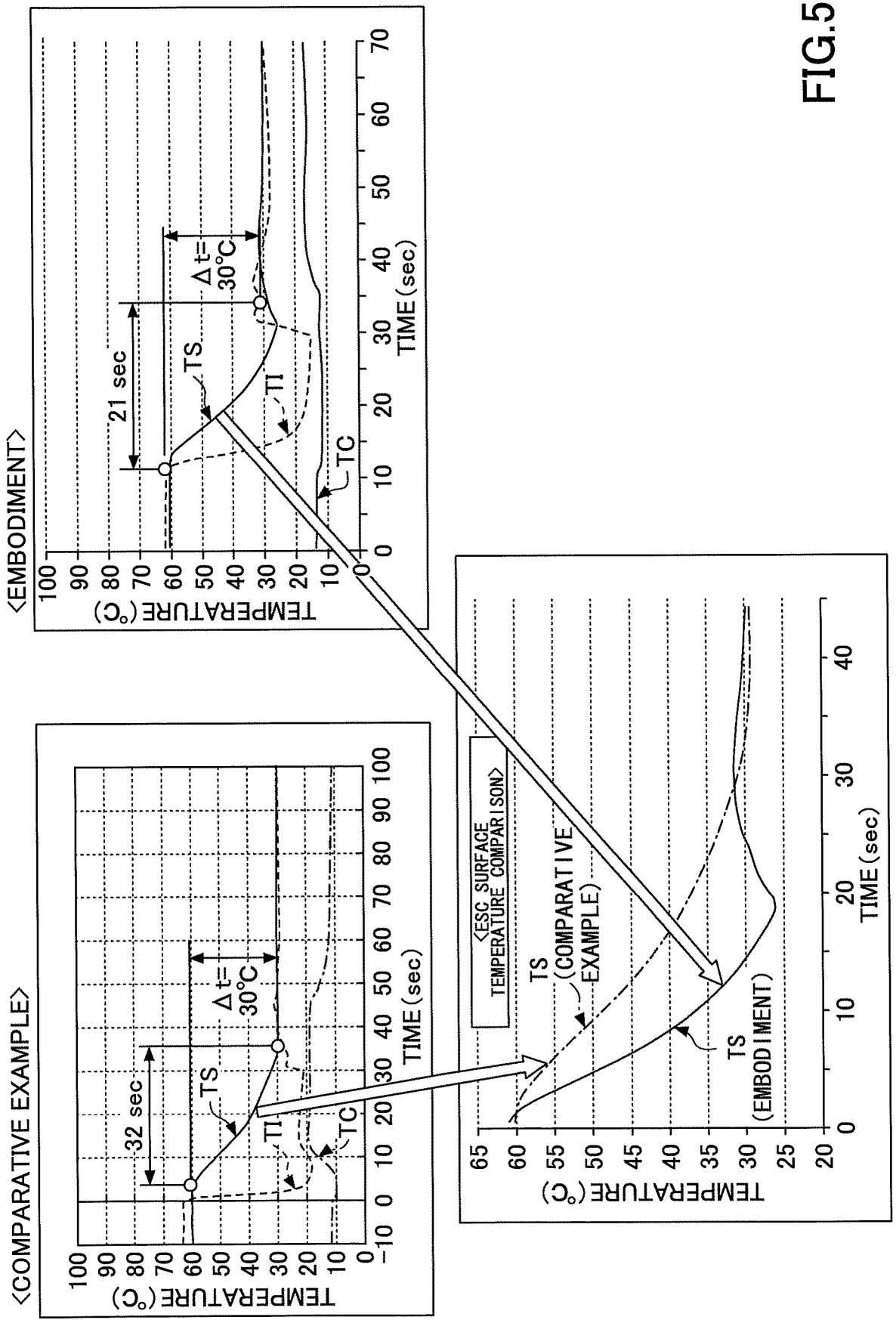
FIG. 5 illustrates cooling capacities of the temperature control systems of the embodiment and the comparative example.

In the following, the cooling capacity of the temperature control system 1 of the present embodiment is described with reference to FIGS. 4 and 5. FIG. 4 includes a schematic view of the temperature control system 1 of the present embodiment corresponding to the temperature control system 1 illustrated in FIG. 1A at the right side. FIG. 4 also includes a schematic view of a temperature control system according to a comparative example at the left side. FIG. 5 includes a graph indicating the cooling effect of the temperature control system 1 of the present embodiment at the right side, and a graph indicating the cooling effect of the temperature control system according to the comparative example at the left side.

In the temperature control system 1 according to the present embodiment, temperature sensors are arranged at four temperature measurement points. Specifically, a temperature sensor that detects temperature TC (cooling line temperature) is arranged at the low-temperature adjustment unit 74, a temperature sensor that detects temperature Th (heating line temperature) is arranged at the high-temperature adjustment unit 75, a temperature sensor that detects temperature TI (susceptor inlet) is arranged at a flow path inlet of the stage, and a temperature sensor that detects temperature TS (susceptor surface temperature) is arranged on the surface of the electrostatic chuck 12.

The temperature control system according to the comparative example includes a volume absorption tank 274, a pump 275, a heating device 277, and a cooling device 279. A flow path 282 forms a circulation path, and the pump 275 is arranged at the flow path 282. The flow path 282 branches out into three different directions at the upstream side of the pump 275 to form a heating flow path 283, a bypass flow path 284, and a cooling flow path 285. The heating device 277 including a heat storage tank as a heating means is arranged midstream of the heating flow path 283, and the heating device 277 heats the fluid flowing within the heating flow path 283. Similarly, the cooling device 279 including a heat storage tank as a cooling means is arranged midstream of the cooling flow path 285, and the cooling device 279 cools the fluid flowing within the cooling flow path 285. Also, valves 283a, 284a, and 285a are used to manipulate the flow rates of fluid flowing within the heating flow path 283, the bypass flow path 284, and the cooling flow path 285, respectively.

Fluid is arranged to flow near an electrostatic chuck 280 corresponding to a member subject to temperature control, and in this way, the temperature of the electrostatic chuck 280 may be controlled. The fluid flowing near the electrostatic chuck 280 is returned to the circulation path via a discharge flow path 281.

Note that the temperature control system according to the comparative example also has temperature sensors arranged at four temperature measurement points in a manner similar to the present embodiment. Specifically, a temperature sensor that detects temperature TC is arranged at the cooling device 279, a temperature sensor that detects temperature Th is arranged at the heating device 277, a temperature sensor that detects temperature TI is arranged at a flow path inlet of the stage, and a temperature sensor that detects temperature TS is arranged on the surface of the electrostatic chuck 280.

In an experiment, the cooling capacities of the temperature control systems having the above-described configurations were compared. FIG. 5 illustrates the results of such experiment. The temperature TS detected by the temperature sensor arranged at the electrostatic chuck on the susceptor surface (stage) corresponds to a target temperature. In the present experiment, after starting a cooling process, the pre-set temperature for the susceptor surface (electrostatic chuck temperature: target temperature TS) was changed from 60° C. to 30° C. and the temperature of the electrostatic chuck was measured to examine how closely the electrostatic chuck temperature follows the pre-set temperature and determine the time required to reduce the target temperature TS by 30° C.

As can be appreciated from the graph on the left side of FIG. 5, in the comparison example, 32 seconds was required to reduce the target temperature TS by Δt=30° C. from 60°

C. to 30° C. On the other hand, as can be appreciated from the graph on the upper right side of FIG. 5, in the present embodiment, only 21 seconds was required to reduce the target temperature TS by Δt=30° C. The results indicate that the cooling capacity of the temperature control system 1 of the present embodiment is approximately 1.5 times that of the comparative example. Further, comparing the detection temperature TC detected by the temperature sensors arranged at the cooling device 279 of the comparative example and the low-temperature adjustment unit 74 of the present embodiment, in the comparative example, a low-temperature of around 10° C. could only be maintained for approximately 6 seconds, whereas in the present embodiment, the low-temperature of around 10° C. could be maintained for approximately 35 seconds. Thus, the cooling capacity of the temperature control system 1 of the present embodiment may be approximately 1.5 times that of the comparative example, and the temperature responsiveness of the temperature control system 1 of the present embodiment may be higher than that of the comparative example as illustrated by the graph at the lower right side of FIG. 5.

[Heating Capacity of Temperature Control System]

Figure 6:
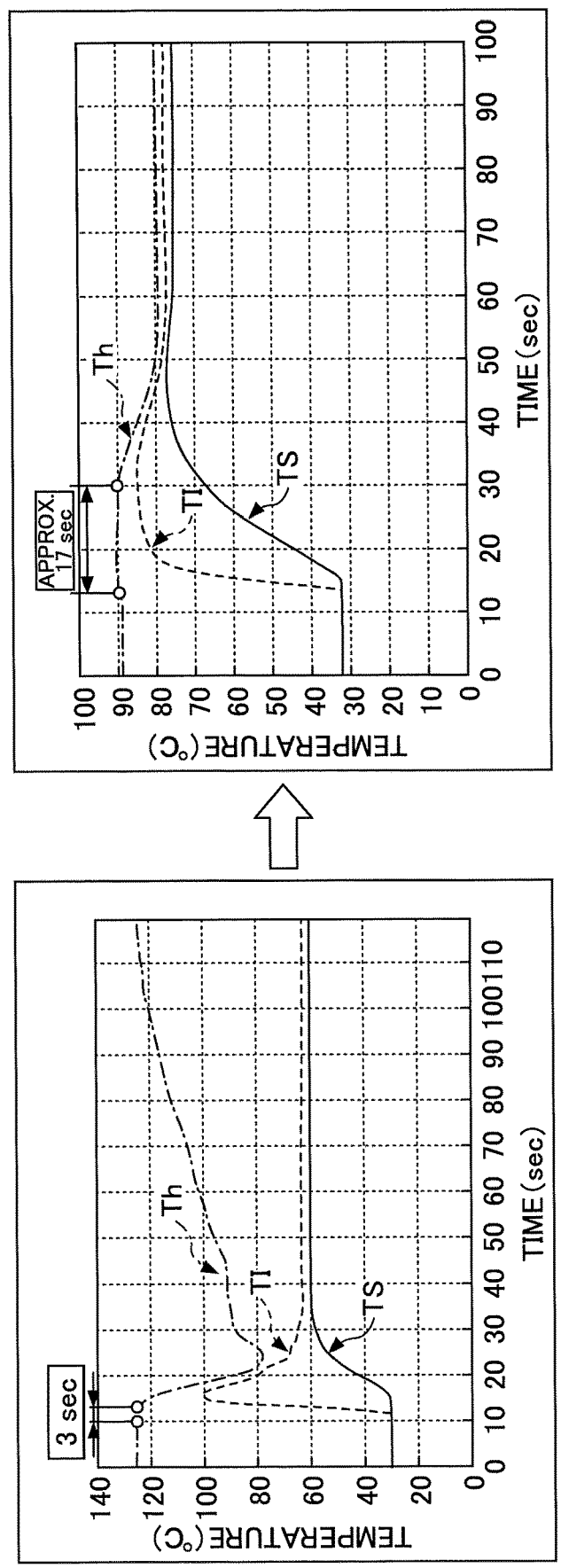
FIG. 6 illustrates heating capacities of the temperature control systems of the embodiment and the comparative example.

As illustrated in FIG. 6, similar advantageous effects could be observed from experimental results obtained by examining the heating effects of the temperature control system 1 of the present embodiment and the comparative example. FIG. 6 includes a graph illustrating the heating effect of the temperature control system 1 of the present embodiment at the right side and a graph illustrating the heating effect of the temperature control system according to the comparative example on the left side.

In the experiment of FIG. 6, the temperature sensors arranged at the low-temperature adjustment unit 74 and the cooling device 279 for detecting the temperature TC were used instead of the temperature sensors arranged at the high-temperature adjustment unit 75 and the heating device 277 for detecting the temperature Th. Also, the temperature sensors at the susceptor inlet for detecting the temperature TI and the temperature sensors at the susceptor surface for detecting the temperature TS were used as in the previously described experiment.

As can be appreciated from the graph at the left side of FIG. 6, in the comparative example, a desired high temperature could be maintained for 3 seconds. On the other hand, as can be appreciated from the graph at the right side of FIG. 6, in the present embodiment, the desired high temperature could be maintained for approximately 17 seconds. The results indicate that the heating capacity of the temperature control system 1 of the present embodiment is at least 5 times that of the comparative example, and the temperature responsiveness to heating in the temperature control system 1 of the present embodiment is also higher than that of the comparative example.

[Modifications]

In the following, exemplary modifications of the temperature control system 1 of the present embodiment are described with reference to FIGS. 7 and 8. In the modification illustrated in FIG. 7, the electrostatic chuck 12 is divided into a center portion 70a and an edge portion 70b and temperature control is separately performed on these portions. In the present modification, a first temperature control system and a second temperature control system having similar configurations are provided for the center portion 70a and the edge portion 70b, respectively. The first temperature control system includes the valve unit 79, check valves 82a-84a, valves 85a and 86a, and a pump 87a; and the second temperature control system includes the valve unit 79, check valves 82b-84b, valves 85b and 86b, and a pump 87b. Further, two low-temperature adjustment units 74a and 74b and two high-temperature adjustment units 75a and 75b interconnected by fluid level adjustment tanks 98a and 98b, respectively, are arranged at the first temperature control system and the second temperature control system.

In the modification illustrated in FIG. 8, the electrostatic chuck 12 is similarly divided into the center portion 70a and the edge portion 70b and temperature control is separately performed on these portions, but only one low-temperature adjustment unit 74 and one high-temperature adjustment unit 75 are provided. That is, the capacities of the low-temperature adjustment unit 74 and the high-temperature adjustment unit 75 are increased so that the low-temperature adjustment unit 74 and the high-temperature adjustment unit 75 may be shared by the first temperature control system and the second temperature control system. In FIG. 8, fluids flowing in the low-temperature flow paths of the first temperature control system and the second temperature control system are returned to the same low-temperature adjustment unit 74 via points G and E. Fluids flowing in the high-temperature flow paths of the first temperature control system and the second temperature control system are returned to the same high-temperature adjustment unit 75 via points D and A. In this way, temperature control may be implemented by one system sharing the low-temperature adjustment unit 74 and the high-temperature adjustment unit 75.

In the modifications described above, temperature control may be separately performed with respect to two zones; i.e., the center portion and the edge portion, of the electrostatic chuck 12. In this way, the temperature of the wafer W may be controlled to be uniform. For example, temperature control of the center portion may be performed in a manner different from temperature control of the edge portion, which is closer to a focus ring and is more easily heated than the center portion, and in this way, temperature control accuracy may be improved.

As can be appreciated from the above, according to an aspect of the present invention, by arranging in parallel a plurality of temperature control units including heat storage tanks and circulation pumps and forming a circulation path for circulating fluids from these temperature control units, a temperature control system 1 that can secure adequate heat storage volume and achieve stable temperature control may be configured. In this way, the temperature of a member subject to temperature control may be promptly raised or lowered. Thus, a temperature stabilization time upon switching a pre-set temperature according to recipe steps may be reduced and productivity may be improved.

Also, a temperature increase of the member subject to temperature control due to plasma energy generated during a process may be promptly restrained, and in this way, stable control of the temperature of the member subject to temperature control may be enabled and a higher yield may be achieved, for example.

Further, although the present invention has been described above with respect to certain illustrative embodiments, the present invention is not limited to these embodiments. That is, additional advantages and modifications will readily occur to those skilled in the art, and the present invention includes numerous variations and modifications that may be made without departing from the scope of the present invention. Also, the above embodiments and modifications may be combined to the extent practicable.

For example, the temperature control method according to the present invention is not limited to controlling the temperature of an electrostatic chuck of a semiconductor manufacturing device but may also be used to control the temperature of an upper electrode, a deposit shield (not shown), or a processing chamber, for example.

Also, temperature control of the present invention is not limited to being implemented in an etching process but may also be implemented in a film deposition process, an ashing process, a sputtering process, or some other plasma process.

Also, the temperature control method of the present invention is not limited to being applied to a parallel-plate type etching apparatus but may also be applied to a cylindrical RLSA (radical line slot antenna) semiconductor manufacturing device, an ICP (inductively coupled plasma) semiconductor manufacturing device, a microwave semiconductor manufacturing device, or some other type of semiconductor manufacturing device.

DESCRIPTION OF THE REFERENCE NUMERALS 1 temperature control system
10 processing chamber
11 stage (lower electrode)
32 high frequency power supply
38 shower head (upper electrode)
40 gas supply source
70 temperature adjustment part
70 combination flow path
73 bypass flow path
74 low-temperature adjustment unit
75 high-temperature adjustment unit
79a, 79b, 79c variable valve
76 low-temperature flow path
77 high-temperature flow path
78 temporary tank
82, 83, 84, 82a, 83a, 84a, 82b, 83b, 84b check valve
85, 86, 85a, 86a, 85b, 86b valve
87, 87a, 87b pump
90 control device
92 temperature control unit
98, 98a, 98b fluid level adjustment tank
100 semiconductor manufacturing device
PA merging part
PB branching part

The invention claimed is:

1. A temperature control system for controlling a temperature of a member used in a semiconductor manufacturing device, the temperature control system comprising:
a first temperature adjustment unit that includes a first heat exchange unit that is configured to adjust fluid to a first temperature and a first tank that is configured to store the fluid that is adjusted to the first temperature by the first heat exchange unit;
a second temperature adjustment unit that includes a second heat exchange unit that is configured to adjust fluid to a second temperature, which is higher than the first temperature, and a second tank that is configured to store the fluid that is adjusted to the second temperature by the second heat exchange unit;
a low-temperature flow path for passing fluid supplied from the first temperature adjustment unit;
a high-temperature flow path for passing fluid supplied from the second temperature adjustment unit;
a bypass flow path for circulating fluid;
a combination flow path for passing fluid from the low-temperature flow path, the high-temperature flow path, and the bypass flow path merged at a merging part;
a temperature adjustment part that is arranged at or near the member and is configured to pass fluid from the combination flow path and cool or heat the member;
variable valves attached to the low-temperature flow path, the high-temperature flow path, and the bypass flow path at an upstream side of the merging part;
a control device that controls valve positions of the variable valves and adjusts a flow rate distribution ratio for the low-temperature flow path, the high-temperature flow path, and the bypass flow path, and
a communication pipe provided between the first tank and the second tank to cancel a level gap between the first tank and the second tank when controlling the temperature of the fluid by the first and second temperature adjustment units, thereby maintaining a fluid level balance between the first tank and the second tank wherein the communication pipe is configured to keep the height of the fluids in the first tank and the second tank the same as each other.

2. The temperature control system as claimed in claim 1, wherein the control device adjusts the valve positions of the variable valves attached to the low-temperature flow path, the high-temperature flow path, and the bypass flow path, and controls a merging flow rate of fluid flowing in the combination flow path to be uniform.

3. The temperature control system as claimed in claim 1, further comprising:
a first temperature sensor that detects the temperature of the member; and
a second temperature sensor that detects a temperature of the combination flow path at a downstream side of the merging part;
wherein the control device feedback-controls the valve positions of the variable valves based on the temperatures detected by the first temperature sensor and the second temperature sensor.

4. The temperature control system as claimed in claim 1, wherein
the combination flow path forms a circulation path for circulating fluid by passing the fluid through the temperature adjustment part and prompting the fluid to branch out to the low-temperature flow path, the high-temperature flow path, and the bypass flow path at a branching part; and
the control device controls a flow rate of the fluid circulating in the temperature adjustment part to be constant.

5. The temperature control system as claimed in claim 1, wherein the merging part includes a temporary tank for mixing the fluids flowing in the low-temperature flow path, the high-temperature flow path, and the bypass flow path.

6. The temperature control system as claimed in claim 1, wherein
while raising the temperature, the control device controls the valve positions of the variable valves such that an amount of fluid flowing into the combination flow path from the high-temperature flow path is greater than an amount of fluid flowing into the combination flow path from the low-temperature flow path and an amount of fluid flowing into the combination flow path from the bypass flow path; and
while lowering the temperature, the control device controls the valve positions of the variable valves such that the amount of fluid flowing into the combination flow path from the low-temperature flow path is greater than the amount of fluid flowing into the combination flow path from the high-temperature flow path and the amount of fluid flowing into the combination flow path from the bypass flow path.

7. The temperature control system as claimed in claim 1, wherein
the member is an electrostatic chuck on which a workpiece is placed;
the temperature adjustment part is divided into a first flow path arranged at a center portion of the electrostatic chuck and a second flow path arranged at an edge portion of the electrostatic chuck; and
the temperature control system includes a first temperature control system that is configured to control a temperature of the center portion of the electrostatic chuck by passing fluid through the first flow path, and a second temperature control system that is configured to control a temperature of the edge portion of the electrostatic chuck by passing fluid through the second flow path.

8. The temperature control system as claimed in claim 7, wherein the first temperature adjustment unit including a first circulation pump and the second temperature adjustment unit including a second circulation pump are provided to each of the first temperature control system and the second temperature control system.

9. The temperature control system as claimed in claim 7, wherein the first temperature adjustment unit including a first circulation pump and the second temperature adjustment unit including a second circulation pump are commonly provided to and shared by the first temperature control system and the second temperature control system.

10. A semiconductor manufacturing device that controls a temperature of an internal member using a temperature control system, the semiconductor manufacturing device comprising:
the temperature control system, which includes
a first temperature adjustment unit that includes a first heat exchange unit that is configured to adjust fluid to a first temperature and a first tank that is configured to store the fluid that is adjusted to the first temperature by the first heat exchange unit;
a second temperature adjustment unit that includes a second heat exchange unit that is configured to adjust fluid to a second temperature, which is higher than the first temperature, and a second tank that is configured to store the fluid that is adjusted to the second temperature by the second heat exchange unit;
a low-temperature flow path for passing fluid supplied from the first temperature adjustment unit;
a high-temperature flow path for passing fluid supplied from the second temperature adjustment unit;
a bypass flow path for circulating fluid;
a combination flow path for passing fluid from the low-temperature flow path, the high-temperature flow path, and the bypass flow path merged at a merging part;
a temperature adjustment part that is arranged at or near the internal member and is configured to pass fluid from the combination flow path and cool or heat the internal member;
variable valves attached to the low-temperature flow path, the high-temperature flow path, and the bypass flow path at an upstream side of the merging part;
a control device that controls valve positions of the variable valves and adjusts a flow rate distribution ratio for the low-temperature flow path, the high-temperature flow path, and the bypass flow path, and
a communication pipe provided between the first tank and the second tank to cancel a level gap between the first tank and the second tank when controlling the temperature of the fluid by the first and second temperature adjustment units, thereby maintaining a fluid level balance between the first tank and the second tank wherein the communication pipe is configured to keep the height of the fluids in the first tank and the second tank the same as each other.

11. The semiconductor manufacturing device as claimed in claim 10, wherein the internal member of the semiconductor manufacturing device includes at least one of an electrostatic chuck, an upper electrode, a deposit shield, and a processing chamber.

12. A temperature control method for controlling a temperature of a member used in a semiconductor manufacturing device, the temperature control method comprising the steps of:
adjusting fluid to a first temperature by a first heat exchanger unit of a first temperature adjustment unit;
storing the fluid that is adjusted to the first temperature in a first tank of the first temperature adjustment unit;
adjusting fluid to a second temperature by a second heat exchanger unit of a second temperature adjustment unit;
storing the fluid that is adjusted to the second temperature, which is higher than the first temperature, in a second tank of the second temperature adjustment unit;
passing fluid supplied from the first temperature adjustment unit through a low-temperature flow path;
passing fluid supplied from the second temperature adjustment unit through a high-temperature flow path;
circulating fluid through a bypass flow path;
merging the fluids flowing in the low-temperature flow path, the high-temperature flow path, and the bypass flow path at a merging part and passing the merged fluid through a combination flow path;
passing fluid from the combination flow path through a temperature adjustment part arranged at or near the member and cooling or heating the member;
controlling valve positions of variable valves attached to the low-temperature flow path, the high-temperature flow path, and the bypass flow path at an upstream side of the merging part, and adjusting a flow rate distribution ratio for the low-temperature flow path, the high-temperature flow path, and the bypass flow path, and
cancelling a level gap between the first tank and the second tank when controlling the temperature of the fluid by the first and second temperature adjustment units by a communication pipe provided between the first and second temperature adjustment units, thereby maintaining a fluid level balance between the first tank and the second tank wherein the communication pipe is configured to keep the height of the fluids in the first tank and the second tank the same as each other.

\* \* \* \* \*